United States Patent

Maute

[15] 3,657,573

[45] Apr. 18, 1972

[54] UNIPOLAR DEVICE WITH MULTIPLE CHANNEL REGIONS OF DIFFERENT CROSS SECTION

[72] Inventor: Hans-Jurgen Maute, Heilbronn-Bockingen, Germany

[73] Assignee: Telefunken Patentverwertungsgesellschaft m.b.H., Ulm/Danube, Germany

[22] Filed: Aug. 28, 1969

[21] Appl. No.: 853,765

[30] Foreign Application Priority Data

Sept. 2, 1968 Germany ......................P 17 64 911.5

[52] U.S. Cl. ..........................307/304, 307/303, 317/235 A, 317/235 D, 317/235 G

[51] Int. Cl. ..........................................................H01l 19/00

[58] Field of Search..................307/304; 317/235; 324/103, 324/72.5

[56] References Cited

UNITED STATES PATENTS

| | | | |
|---|---|---|---|
| 3,274,461 | 9/1966 | Teszner | 317/235 |
| 3,358,195 | 12/1967 | Onodera | 317/234 |
| 3,309,610 | 3/1967 | Yamamoto | 307/304 X |
| 3,354,362 | 11/1967 | Zuleeg | 317/235 |

*Primary Examiner*—John W. Huckert
*Assistant Examiner*—William D. Larkins
*Attorney*—Spencer & Kaye

[57] ABSTRACT

The invention relates to a unipolar device comprising a semi conductor body having a region of, for example, P or $P^+$-type conductivity which is traversed by channel-like regions of N-type conductivity having different cross sections. A control voltage applied across the PN-junctions thus formed so as to stress the junctions in the reverse direction will cause pinching off of the channel-like regions in the sequence of their increasing cross sections as the control voltage rises. The invention also includes circuitry by means of which this pinching off can be used to provide indications of the value of the control voltage where the channel-like regions each have a separate electrode. This circuitry includes branch circuits, each comprising an indicating element, which may be incandescent lamps and/or relay windings for the control of for the circuits, and a channel like region, connected in parallel across a voltage source.

4 Claims, 6 Drawing Figures

Inventor:

Hans-Jürgen Maute

By: Spencer & Kaye

Attorneys

Inventor:
Hans-Jürgen Maute
By: Spencer & Kaye
Attorneys

UNIPOLAR DEVICE WITH MULTIPLE CHANNEL REGIONS OF DIFFERENT CROSS SECTION

BACKGROUND OF THE INVENTION

The present invention relates to a unipolar device which is used, for example, as a unipolar or field-effect transistor.

A unipolar transistor is already known consisting of a plate-shaped semiconductor body with a region of the first type of conductivity, which is traversed by channel-like regions of the second type of conductivity extending parallel to one another. In this case, the channel-like regions are provided, at opposite surfaces of the semiconductor body, with flat electrical contacts while the region of the first type of conductivity is connected to a control electrode which is likewise flat. The channel-like regions extend perpendicular to the surfaces of the semiconductor body. In the development of unipolar transistors, there has been a changeover from a single current-carrying channel to a plurality of such channels having the same cross-section in order to increase the efficiency and sensitivity of the unipolar device. The control limit of unipolar transistors with a plurality of parallel channels having the same cross-section is determined by the control voltage at which the current-carrying channels are completely pinched off by the space-charge regions free of charge carriers originating from the PN-junctions operated in the reverse direction, as a result of which a flow of current through the channels is prevented.

SUMMARY OF THE INVENTION

According to the invention there is provided a unipolar device comprising a plate like semiconductor body, a region of a first type of conductivity in said semiconductor body, parallel channel like regions of a second type of conductivity and of different cross sections traversing said region of said first type of conductivity, flat electrical contact means on opposite faces of said semiconductor body for providing contact with said channel like regions and a flat electrical contact on said region of said first type of conductivity.

BRIEF DESCRIPTION OF THE DRAWINGS.

The invention will now be described in greater detail, by way of example, with reference to the accompanying drawings in which.

DESCRIPTION OF THE PREFERRED EMBODIMENTS

Figures 1, 2, 3, 4:
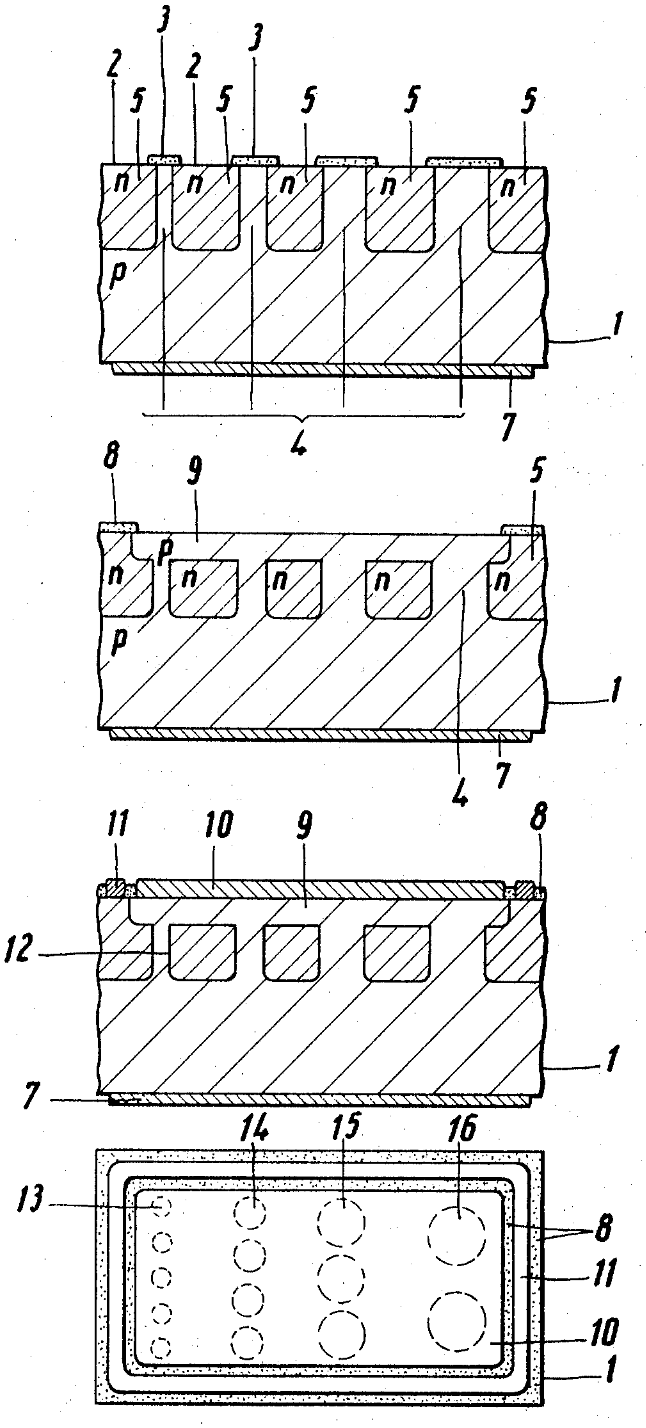
FIG. 1 shows a stage in the production of a unipolar device in accordance with the invention in which a semiconductor body of P- or $P^+$-type conductivity is provided with a region of n-type conductivity traversed by channel like regions of P- or $P^+$-type conductivity.
FIG. 2 shows a further stage in which a connecting region of P- or $P^+$-type conductivity is provided for connecting one of the ends of the channel-like regions together.
FIG. 3 shows a completed unipolar device in section.
FIG. 4 shows, in plan view, the unipolar device of FIG. 3.

In order to improve the above described known unipolar devices and to extend the field of application of these devices, the invention provides basically for the channel-like regions to have different cross sections.

By this means, the sensitivity of the unipolar device to very low control voltages can be increased without the maximum control limit being reduced. The cross sections of the current-carrying channels are so selected that some channels are already cut off completely from carrying current at very low values of the applied control voltage while the channels having the largest cross-section are only pinched off at the maximum control voltage which occurs or the maximum permissible control voltage. By this means, a unipolar device is obtained which is very sensitive, particularly in the range of low control voltages, and this is a characteristic which is particularly desirable for many applications. Since only some of the channels have the cross-section which is necessary for controllability up to the maximum control voltage, very many more channels can be accommodated on the same area of the semiconductor body; the sensitivity of the device is likewise considerably increased by this means, particularly with low values of the control voltage.

In order to use the device according to the invention as a unipolar transistor, all the channel-like regions of the second type of conductivity preferably lead, at the two opposite surfaces of a semiconductor body, into a connecting region which is common to all the channels. By this means, all the current-conducting channels which are connected in parallel can be covered by two large-area contact electrodes at the two opposite surfaces of the semiconductor body.

The unipolar device according to the invention may, however, also be used for voltage measurement or for the control and regulation of equipment of all kinds. In this case, the unipolar device would be so constructed that at one surface of the semiconductor body, all the channel-like regions lead into a connecting region which is common to all the channels and which is of the type of conductivity of the channel-like regions, while at the other surface of the semiconductor body the channels of the second type of conductivity are separated from one another by areas of the region of the first type of conductivity. At this surface, all the channels are then provided with a separate electrical contact. In order to be able to use the unipolar device just described for measuring voltage or for control and regulation, the measuring or control voltage is applied to the ohmic electrode which makes contact to the region of the first type of conductivity, in such a manner that the PN-junctions between the region of the first type of conductivity and the channel-like regions of the second type of conductivity are stressed in the reverse direction. The separate electrical contacts of the individual channels are connected to indicating and/or control elements. All branch circuits from the channel-like regions and the control and/or indicating elements connected up are connected in parallel and connected to a source of supply voltage. The windings of relays may be used as control elements for example, other electrical circuits being closed or interrupted by their switching contacts. Incandescent lamps are particularly suitable as indicating elements.

Referring now to the drawings, in FIG. 1, a semiconductor body 1 is illustrated which is of the P-type or $P^+$-type conductivity for example. This semiconductor body is covered at its surface 2 with a coherent oxide mask 3 which shields the semiconductor regions 4, provided for the channel-like regions, from the impurities provided for the indiffusion. In the exposed regions of the semiconductor body at said surface, an impurity material is then diffused in and produces an N-doped region 5, perforated in a screen-like manner by the channels 4 in the semiconductor body. The oxide mask 3 is so dimensioned that the remaining channels 4 of P-type or $P^+$-type conductivity, which are surrounded by areas of the region 5 of N-type conductivity, have different cross-sections. The channels 4, which may be cylindrical for example, preferably have diameters of between 1 and 10 $\mu$m. At the surface of the semiconductor body opposite the surface 2, the cylindrical channels 4 lead into the region 6 of P-type conductivity which is common to all the channels and which is provided with a flat electrical contact 7 which may be vapour-deposited for example. The oxide layer 3 is removed at the surface 2 of the semiconductor body and replaced by a fresh oxide mask 8 which only covers the marginal surface region of the semiconductor body (FIG. 2). Then fresh impurity material which produces the p-type conductivity is diffused into the semiconductor body through the opening in the oxide layer 8, so that m the channels at the surface 2 of the semiconductor body are connected to one another by a further region 9 of P-type conductivity which is common to all the channels. The remaining length of the cylindrical channels 4 may amount to several $\mu$ for example. The region 9 of P-type conductivity is provided with a further flat electrode 10 as shown in FIG. 3. The electrodes 7 and 10, which are connected to the channel-like regions 4 at opposite surfaces of the semiconductor body serve as source and drain electrodes while the electrode 11 connected to the region 5 of n-type conductivity at the edge of the surface 2 of the semiconductor should be regarded as a gate.

The control voltage is now applied between the electrodes 11 and 7 so that the PN-junctions 12 between the region 5 of N-type conductivity and the channels 4 are stressed in the reverse direction. As can be seen from the plan view in FIG. 4, there are various groups 13 to 16 of channel-like regions in the semiconductor body all the channels in each group having the same cross-section but the cross-section of the channels in each group differing from the cross-sections of the other channels. The channels 13 are first pinched off by the expanding space-charged region free of charge carriers as the control voltage rises, thus leading to an appreciable increase in the resistance between the drain electrode and the source electrode of the unipolar device. On a further increase in control voltage, the groups of channels 14 to 16 are pinched off in succession and the sensitivity of the device decreases as the control voltage increases although the maximum controllability determined by the cross-section of the group of channels 16 is retained.

Figure 5:
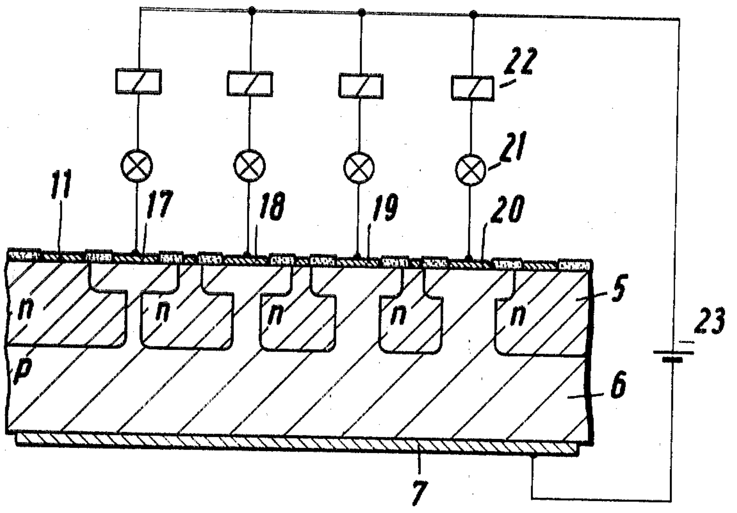
FIG. 5 shows, in section, a second form of unipolar device in accordance with the invention.

FIG. 5 illustrates a unipolar device according to the invention wherein the channels are only connected to one another at one surface of the semiconductor body through a region 6 of P-type conductivity, common to all the channels. At the opposite surface, each channel is provided with a separate electrode 17 to 20 and is insulated from the adjacent channels by areas of the region 5 of N-type conductivity. An incandescent lamp 21 and a relay winding 22 in series for example are connected to each electrode. All of the branch circuits of the channels of P-type conductivity, i.e. the incandescent lamp 21 and the relay winding 22 in each case, are connected in parallel and connected to a source 23 of supply voltage. The drain electrode 7 is also connected to the electrode of the source 23 of supply voltage which is still free. The relay windings and the incandescent lamps may be so selected that all the relays are attracted when the control voltage is zero and all the incandescent lamps light up. When a control voltage is applied between the gate 11 and the drain electrode 7, and stresses the PN junctions between the channel-like regions 4 and the region 5 of N-type conductivity in the reverse direction, the expanding space-charge regions which is free of charge carriers first pinches off the channel belonging to the gate 17, the incandescent lamp is extinguished and the relay releases. On a further rise in the control voltage, the incandescent lamp associated with the electrode 18 likewise goes out and the relay in this circuit is also released. The same applies to the circuits associated with the electrodes 19 and 20 as the control voltage increases further. In this manner, the value of the control voltage can easily be read off from the number of incandescent lamps which have gone out. If the control voltage corresponds to the water level in a water supply tank for example, pumps can be controlled by the release of the relays in such a manner that with the highest water level all the available pumps are working and as the water level drops one pump after the other is switched off. The number of incandescent lamps still burning is a measure of the particular water level at the same time. Further classification and group division may be carried out with the device shown in FIG. 5, according to the invention. This is the case, for example, when the control voltage corresponds to the current amplification factor of transistors to be measured and classified. The current amplification group of the transistor measured can be read off immediately by the particular incandescent lamp switched off last. It is easy to imagine a large number of further possible applications for the device according to the invention as shown in FIG. 5.

Figure 6:
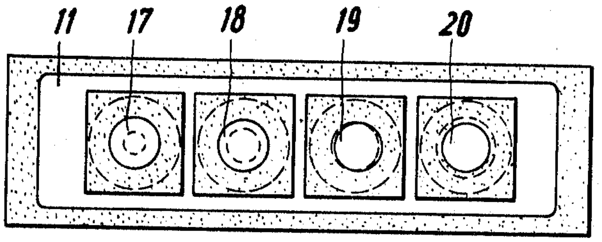
FIG. 6 shows the unipolar device of the FIG. 4 in plan view.

In FIG. 6, the device of FIG. 5 is illustrated again in plan view. The number of channels may, of course, be varied as desired. The same also applies to the difference in cross-section from channel to channel. It is obvious that, in the arrangement according to the invention, the doping of the individual regions may be varied to a wide extent and may be adapted to the requirements. The types of conductivity of the regions described in the Figures may be exchanged for the opposite type of conductivity in each case.

What I claim as new and desire to secure by Letters Patent of the United States is:

1. A unipolar device comprising: a plate-like semiconductor body having two opposed major surfaces, a region of a first type of conductivity extending to one major surface of said semiconductor body; a plurality of parallel channel-like regions of the opposite conductivity-type traversing said region of said first type of conductivity and individually extending to said one major surface of said body, said channel-like regions having different cross-sections with respect to one another; a connecting region adjacent the opposite one of said major surfaces of said semiconductor body and of said second type of conductivity for connecting said channel like regions together; a flat electrical contact positioned on said opposite one of said major surfaces of said semiconductor body for contacting said connecting region; a plurality of flat electrical contacts, one for contacting the end of a separate one of each said channel like regions, located on said one major surface of said semiconductor body for connecting said channels to separate loads; and, a flat electrical contact located on said one major surface of said semiconductor body for contacting said region of said first type of conductivity.

2. In combination, a unipolar device as defined in claim 1, with a circuit arrangement for the operation of said unipolar device, said circuit arrangement comprising means for applying to the electrical contact for said region of said first type of conductivity a control voltage for stressing the PN-junctions between said region of said first conductivity and said channel like regions in the reverse direction, a supply voltage, indicating elements connected to said plurality of flat electrical contacts to provide branch circuits each including one of said indicating elements and a channel-like region, and means for connecting said branch circuits in parallel to said supply voltage.

3. The combination as defined in claim 2, wherein the indicating elements comprise the windings of relays for the control of further electrical circuits which are closed or opened through the switch contacts of said relays.

4. The combination as defined in claim 2, wherein the indicating elements comprise incandescent lamps.

* * * * *